United States Patent [19]

Nakagawa

[11] Patent Number: 5,126,075
[45] Date of Patent: Jun. 30, 1992

[54] MATERIAL FOR A HOUSING OF ELECTRONIC COMPONENTS

[75] Inventor: Asaharu Nakagawa, Yokkaichi, Japan

[73] Assignee: Kitogawa Industries Co., Ltd., Nagoya, Japan

[21] Appl. No.: 427,526

[22] Filed: Oct. 27, 1989

[30] Foreign Application Priority Data

Nov. 4, 1988 [JP] Japan ................. 63-280120

[51] Int. Cl.$^5$ ............ H01B 1/06; C08J 3/40; C08J 3/22
[52] U.S. Cl. .................... 252/511; 252/506; 252/503; 252/507; 252/518; 252/519; 252/520; 524/495; 524/496; 524/431; 524/435; 524/408; 524/413; 524/401; 523/513; 523/514; 523/515; 523/516
[58] Field of Search .......... 252/511, 513, 506, 519, 252/507, 518, 520; 524/495, 401, 496, 435, 431, 408, 413; 523/137, 512–516

[56] References Cited

U.S. PATENT DOCUMENTS 4,816,184  3/1989  Fukuda et al. ................ 252/511

FOREIGN PATENT DOCUMENTS 53-124412 10/1973 Japan .
58-71700  4/1983 Japan .
59-217736 12/1984 Japan .
62-205156  9/1987 Japan .
2159822  5/1985 United Kingdom .

Primary Examiner—Josephine Barr

[57] ABSTRACT

Material for a housing of electronic components, a compound of synthetic resin, which contains ferrite powder and carbon fiber, is bestowed with original properties of the synthetic resin, such as lightness and freedom of molding, high permeability brought by ferrite powder, and high conductivity and mechanical properties by a designated carbon fiber. The material is made into a light housing with various shapes by injection molding or vacuum molding. The housing concentrates on its surface magnetic flux from external low-frequency field and shields the electronic components from electromagnetic wave noise and low-frequency magnetic field, preventing electromagnetic troubles of the electronic components.

6 Claims, No Drawings

MATERIAL FOR A HOUSING OF ELECTRONIC COMPONENTS

BACKGROUND OF THE INVENTION

This invention relates to material for a housing of electronic components for protecting the electronic components from external electromagnetic wave noise.

In recent years, digital apparatus, including microcomputers, have been developing remarkably and are used widely in office equipment, household electric appliances, automobiles, etc. In addition, microcomputers with higher integration and higher clock frequency have been increasing in number. However, electromagnetic wave noise generated in the electronic components, or the like, is carried away on signal conductors, such as flat cables, or has a direct effect on the electronic components. Such electromagnetic wave noise brings about breakdowns, troubles, and faulty operations of the electronic components controlled and driven by weak electric current. Moreover, since magnetic recording elements with high density in the electronic components are made of a magnetic substance by small magnetic energy, data recorded in these elements is extinguished by external magnetic fields caused by magnets, or the like.

In the prior art, the material used for a housing of electronic components, for example a conductive metallic material, such as iron or copper, or synthetic resin material containing carbon black particles as a conductive filler, shields electronic components from external electromagnetic wave noise.

However, each of these two kinds of prior-art material is imperfect and has problems.

Synthetic resin material bestowed with conductivity by carbon black contained therein has two advantages: it is light and can be molded into various shapes with more freedom by injection molding, vacuum molding, etc. On the other hand, it has a disadvantage: the more carbon black particles it contains, the less strength the synthetic resin has. Therefore, the content of carbon black particles has an upper limit, because the synthetic resin material must maintain a certain strength so as to house electronic components and resist external force. Therefore, conductivity, or electrical resistivity, of the housing of electronic components made of such conductive synthetic resin can only be reduced to about 100 ohm.cm. In addition, since the conductive synthetic resin material is a non-magnetic substance, magnets must be attached on the surface of the housing. The magnets cannot perfectly shield the electronic components from a low-frequency magnetic field, and breakdowns or faulty operations of the electronic components are brought about. The housing of electronic components is referred to as 'housing' below.

Conductive metallic material, the other prior-art material for a housing, is bestowed with high permeability and low electric resistivity of about $10^{-5}$ ohm.cm. Unlike the aforementioned conductive synthetic resin material, a housing made of conductive metallic material, such as iron plate, can concentrate on its surface magnetic flux of electromagnetic wave noise from electronic components and also prevent electronic components from troubles or faulty operation caused by a low-frequency magnetic field. However, the metallic plate must be thick enough to maintain designated strength, so it cannot be lightened to a sufficient extent. Moreover, metallic material is molded into only limited shapes by a press molding, partly because irregular parts orthogonal to the driving direction of a press die are difficult to shape.

SUMMARY OF THE INVENTION

It is an object of this invention to provide material for a housing which can prevent electromagnetic troubles caused by a low-frequency magnetic field or electromagnetic wave noise and can easily be made into light housings of various shapes.

The object is realized by synthetic resin material for a housing, comprising synthetic resin as a base material, ferrite powder, and carbon fiber. Carbon fiber, which is made of hydrocarbon by a pyrolytic vapor phase system and has a nucleus of hyperfine powders of a high-melting metal and/or one of its compounds, and ferrite powder are added to the synthetic resin.

DETAILED DESCRIPTION OF PREFERRED EMBODIMENTS

Material of this invention for a housing is compound material of synthetic resin, which contains ferrite powder and is reinforced with designated carbon fiber. As synthetic resin, polyester resin, vinyl resin, or polyamide resin can be used.

Unlike polyacrylonitrile carbon fiber or pitch carbon fiber, the carbon fiber is similar to whiskers in shape, and has a micro diameter almost the same as that of hyperfine powder of high-melting metal and/or its compound. Such whisker-shaped carbon fiber is superior in that it can be adhered to and also be dispersed and kept evenly all over the synthetic resin base material. The carbon fiber based on graphite crystal layer with regular lattices having few defects possesses low electric resistivity, or high conductivity, and desirable mechanical properties such as high tensile strength. Therefore, the carbon fiber dispersed and kept in base material gives conductivity and superior mechanical properties to the base material. The conductive synthetic resin material for a housing can shield the electronic components from electromagnetic wave noise, by reflecting the noise from the outside and absorbing the noise from electronic components on the inside.

The degree of conductivity or electric resistivity depends on the content of the carbon fiber in the synthetic resin. When carbon fiber increases to a designated quantity enough to keep the fibers in contact with one another, the electric resistivity of the material becomes almost the same as that of the carbon fiber alone. The designated quantity is about 30 % by volume of the synthetic resin. In other words, the preferable quantity of the carbon fiber to decrease electric resistivity is above at least 20% by volume of the synthetic resin.

High-melting metals used as nuclei of carbon fiber of this invention must not be vaporized between 950° C. and 1300° C., where hydrocarbon is pyrolized. Preferable metals are Ti and Zr in IVB group, V and Nb in VB group, Cr and Mo in VIB group, Mn in VIIB group, and Fe and Co in VIII group in a periodic table. Fe, Co, Ni, V, Nb, Ta, Ti and Zr are the most preferable. The compounds of these metals are their oxides, nitrides, and salts.

The ferrite powder, which can be produced in large quantities by means of a known powder metallurgy, has high permeability even in a high-frequency field. The synthetic resin material bestowed with high permeability brought by the ferrite powder shields the inside of the housing from the outside magnetic field.

It is to be desired that the content of the ferrite powder dispersed and kept in the synthetic resin is at least 2% by volume of the synthetic resin, because the synthetic resin possesses high permeability even if the grains of ferrite powder do not touch one another.

EXPERIMENT

Table 2 shows measured values regarding properties, such as electric resistivity and density, of the material for a housing of this invention and of prior-art material for a housing. In the material of this invention, ferrite powder of about 4 $\mu$m grain diameter, and carbon fiber of diameter between 0.1 $\mu$m and 0.5 $\mu$m and of length between 0.1 mm and 1 mm are added to ABS resin. The carbon fiber is created in a furnace between 950° C. and 1300° C. by means of a vapor phase system where benzene is pyrolized, and has a nucleus of iron powder of grain diameter between 0.02 $\mu$m and 0.03 $\mu$m. In this experiment test piece No. 1 described in JIS (Japanese Industrial Standard) is utilized. Table 1 shows properties of resin, ferrite powder, carbon fiber, and carbon black particles, which are mixed to have the composition ratio described below.

Invention A . . .
  ABS resin : 78 volume percentage
  Ferrite particles : 2 volume percentage
  Carbon fiber : 20 volume percentage
Invention B . . .
  ABS resin : 65 volume percentage
  Ferrite particles 5 volume percentage
  Carbon fiber : 30 volume percentage
Comparison C . . .
  ABS resin : 70 volume percentage
  Carbon black particles: 30 volume percentage (Comparison C) cannot obtain, owing to ferrite powder dispersed and kept in the material.

As the synthetic resin contains more than 20% by volume of the carbon fiber, the lattices of the carbon fiber become smaller and smaller, because the carbon fiber links and intersects with one another more frequently. Therefore, synthetic resin material, where the carbon fiber content is adjusted to at least 20% by volume of the material in accordance with frequency of electromagnetic wave noise generated, provides more effective countermeasures against electromagnetic wave noise.

What is claimed is:

1. A housing material for a housing of electrical components, comprising:
   a base material of synthetic resin;
   carbon fibers having a nucleus of a high melting metal; and
   ferrite powder;
   wherein the carbon fibers and ferrite powder are uniformly dispersed in the base material such that the housing material contains at least 20% by volume of carbon fiber and at least 2% by volume of ferrite powder.

2. The housing material of claim 1, wherein the carbon fibers have a diameter between 0.1 microns and 0.5 microns and a length between 0.1 millimeter and 1.0 millimeter.

3. The housing material of claim 1, wherein the base material is selected from the group consisting of polyester resin, vinyl resin, and polyamide resin.

4. The housing material of claim 1 wherein said high-melting metal is selected from a group consisting of iron, cobalt, nickel, vanadium, niobium, tantalum, titanium, zirconium and the nitrides, oxides and salts thereof.

TABLE 1

| | VOLUME RESISTIVITY (ohm · cm) | DENSITY (g/cm$^3$) | MAGNETIC PERMEABILITY COMPARED WITH INITIAL VALUE |
|---|---|---|---|
| ABS RESIN | 12 × 10$^{15}$ | 1.04 | — |
| FERRITE POWDER | — | 5.6 | 800 |
| CARBON FIBER | 4 × 10$^{-3}$ | 1.86 | — |
| CARBON BLACK PARTICLES | — | — | — |

TABLE 2

| | COMPOSITION RATIO *1 (VOLUME %) | COMPOSITION RATIO *2 (VOLUME %) | VOLUME RESISTIVITY (ohm · cm) | DENSITY (g/cm$^3$) | SHIELDING EFFECT (dB) *3 ELECTRICAL FIELD | SHIELDING EFFECT (dB) *3 MAGNETIC FIELD |
|---|---|---|---|---|---|---|
| INVENTION A | 2 | 20 | 2 | 1.29 | 20 | 12 |
| INVENTION B | 5 | 30 | 9 × 10$^{-3}$ | 1.42 | 46 | 21 |
| COMPARISON C | — | 30 | 6 | 1.03 | 28 | BELOW 5 |

*1 . . . COMPOSITION RATIO OF FERRITE POWDER
*2 . . . COMPOSITION RATIO OF CARBON FIBER OR CARBON BLACK PARTICLES
*3 . . . SHIELDING EFFECT IN ELECTRICAL FIELD OF 500 MHz OR MAGNETIC FIELD OF 10 KHz

As seen from the result of the experiment, a housing made of the material of this invention has mechanical properties and conductivity superior to and is as light as a housing of prior-art material. In addition, it is endowed with high permeability, which prior-art material 5. The housing material of claim 1 wherein the quantity of carbon fiber is about 30 percent by volume.

6. The housing material of claim 1 wherein the ferrite powder has a grain diameter of four microns.

* * * * *

UNITED STATES PATENT AND TRADEMARK OFFICE
CERTIFICATE OF CORRECTION

PATENT NO. : 5,126,075

DATED : June 30, 1992

INVENTOR(S) : Asaharu NAKAGAWA and Morinobu ENDO

It is certified that error appears in the above-identified patent and that said Letters Patent is hereby corrected as shown below:

On title page, item

[75] change "Asaharu Nakagawa, Yokkaichi, Japan" to --Asaharu Nakagawa, Yokkaichi, and Morinobu Endo, Suzaka, both of Japan--

Column 1, line 26, delete "," after "magnets".

Column 2, line 55, delete "above",

Column 3, line 32, insert --:-- after "particles".

Signed and Sealed this

Twenty-fourth Day of August, 1993

Attest:

BRUCE LEHMAN

*Attesting Officer*       *Commissioner of Patents and Trademarks*

UNITED STATES PATENT AND TRADEMARK OFFICE
CERTIFICATE OF CORRECTION

PATENT NO. : 5,126,075

DATED : June 30, 1992

INVENTOR(S) : Asaharu NAKAGAWA and Morinobu ENDO

It is certified that error appears in the above-identified patent and that said Letters Patent is hereby corrected as shown below:

ON THE TITLE PAGE:

Below line [19] change "Nakagawa" to
--Nakagawa et al.--

[75] change "Asaharu Nakagawa, Yokkaichi, Japan" to --Asaharu Nakagawa, Yokkaichi, and Morinobu Endo, Kitahara, both of Japan--

[73] change "Kitogawa Industries Co., Ltd.," to --Kitagawa Industries Co., Ltd.,--

Signed and Sealed this

Twenty-fifth Day of January, 1994

Attest:

BRUCE LEHMAN

*Attesting Officer*  *Commissioner of Patents and Trademarks*